United States Patent [19]
Meijer

[11] 3,947,828
[45] Mar. 30, 1976

[54] ANALOG MEMORY SYSTEM USING A TEMPERATURE SENSITIVE DEVICE

[75] Inventor: Robert S. Meijer, Montreal, Canada

[73] Assignee: Multi-State Devices, Ltd., Dorval, Canada

[22] Filed: Feb. 11, 1975

[21] Appl. No.: 549,058

[30] Foreign Application Priority Data
Nov. 12, 1974 Canada .................................. 213521

[52] U.S. Cl. ............................ 340/173 R; 307/310
[51] Int. Cl.² .................. G11C 27/00; G11C 15/00; G11C 11/56
[58] Field of Search.. 340/173 R, 173 CH, 173 AM; 307/308, 310; 357/28

[56] References Cited
UNITED STATES PATENTS

| | | | |
|---|---|---|---|
| 3,573,495 | 4/1971 | Xylander | 307/310 |
| 3,835,458 | 10/1974 | Mrazek | 340/173 R |
| 3,851,316 | 11/1974 | Kodama | 340/173 R |

*Primary Examiner*—Alfred H. Eddleman
*Attorney, Agent, or Firm*—Spencer & Kaye

[57] ABSTRACT

An analog memory system is disclosed which uses a temperature sensitive device exhibiting a significant hysteresis centered about a predetermined transition temperature and a significant impedance change about such transition temperature to allow discrimination of a large number of identical temperature impedance levels with conventional electronic circuitry. The memory system comprises means for adjusting the temperature of such temperature sensitive device to write-in an input signal in the form of a predetermined impedance of said temperature sensitive device, means for subsequently adjusting the temperature of said temperature sensitive device at such transition temperature to store the input signal, and a converter for accurately converting the impedance of the temperature sensitive device to an analog of the signal stored in the memory system.

5 Claims, 3 Drawing Figures

ANALOG MEMORY SYSTEM USING A TEMPERATURE SENSITIVE DEVICE

This invention relates to an analog memory system.

The known analog memory systems are generally of the sample and hold type, the memistor type, or the anlaog-digital-analog type.

The sample and hold technique makes use of a capacitor to store the signal. These systems have the following disadvantages:

a. The capacitor always shows finite internal leakage. Because of this leakage, the time over which the capacitor can store a given charge is intrinsically limited.

b. All schemes for "reading out" the value on the capacitor cause the charge on the capacitor to change. This mechanism, like mechanism "a" above places an additional limitation on the time over which a given charge can be accurately stored.

c. All "refresh" schemes intended to mitigate failings "a" and "b" above suffer from well known control loop limitations, i.e., any control loop must operate on a finite error.

The memistors generally consist of an elongated container filled with an ionic solution and provided with contact terminals at both ends of the chamber. By passing low D.C. current through an ionic solution, plating or deplating can be made to take place. These processes respectively decrease or increase the number of free ions in the solution. The number of ions in the solution in turn affects the resistivity of the solution. A given resistivity is taken as the value stored in the analog memory. The memistor has the following disadvantages:

a. It is difficult to construct.
b. It is temperature sensitive.
c. It produces its own e.m.f.
d. It takes a long time to store the required signal.
e. The signal stored degrades with repeated cycling.
f. The memistor requires A.C. readout.

The analog-digital-analog converters provide quantized outputs which, as commonly known, give only an approximate reproduction of the original signal. In addition, they require complicated sampling, coding and decoding apparatus which render the system expensive.

It is therefore the object of the present invention to provide an analog memory system which is of simple construction, can accurately and rapidly store a given signal, does not degrade with repeated cycling operations, and is relatively inexpensive to manufacture.

The analog memory system, in accordance with the invention, makes use of a temperature sensitive device exhibiting a significant hysteresis centered about a predetermined transition temperature and a significant impedance change about such transition temperature to allow discrimation of a large number of identical temperature impedance levels with conventional electronic circuitry. The memory system comprises means for adjusting the temperature of the temperature sensitive device so as to write-in an input signal to be stored in the form of a predetermined impedance of such temperature sensitive device, means for subsequently adjusting the temperature of such temperature sensitive device at said transition temperature to store the input signal, and a converter for accurately converting the impedance of the temperature sensitive device to an analog of the signal stored in the memory system.

The means for writing-in the input signal to be stored may comprise a heater for heating the temperature sensitive device, a comparator having a first input adapted for connection to a source of input signal to be stored, a second input connected to the output of the converter and an output terminal, and switching means for connecting the output terminal of the comparator to the heater in the write-in mode of the memory system.

The means for adjusting the temperature of the temperature sensitive device at the transition temperature may comprise a source of reference signal representing such a transition temperature, a temperature sensor capable of generating a signal representing the temperature of the temperature sensitive device, and a second comparator having a first input connected to the source of reference signal, a second input connected to the source of sensor signal, such switching means connecting the output of the second comparator to the heater in the store mode of the memory system for adjusting the current flowing through the heater so as to maintain the temperature of the temperature sensitive device at such transition temperature. Preferably, the comparator comprises a bridge circuit which includes the temperature sensor as one of the legs of the bridge and an operational amplifier for amplifying the output of the bridge circuit.

The switching means may be a field effect transistor and means may be provided for enabling such field effect transistor at desired times so as to establish write-in or store operations.

The invention will now be disclosed, by way of example, with reference to a preferred embodiment thereof illustrated in the accompaying drawings in which.

Figure 1:
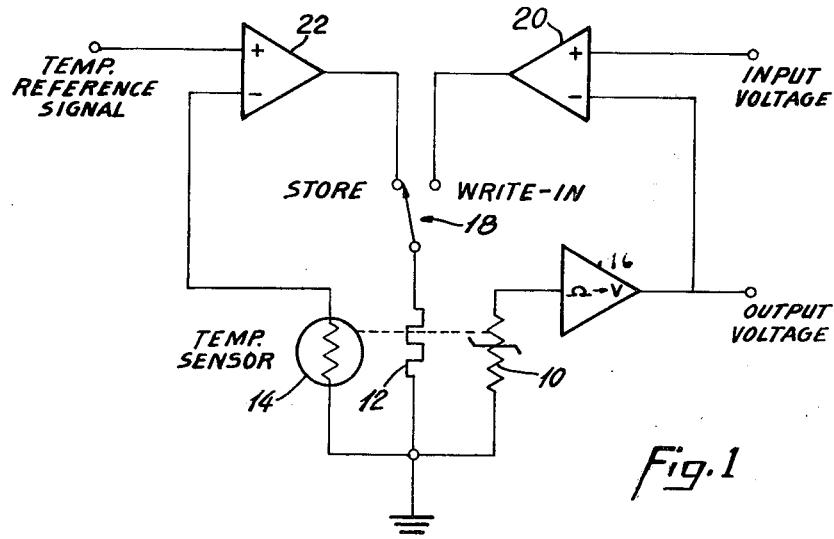
FIG. 1 illustrates a block diagram of an embodiment of the invention.

Referring to FIG. 1, there is shown the block diagram of a preferred embodiment of an analog memory system in accordance with the invention. The memory system comprises a temperature sensitive device 10 which is heated by a heater 12 and the temperature of which is sensed by a temperature sensor 14. Heater 12 and temperature sensor 14 are thermally coupled to temperature sensitive device 10.

Figure 2:
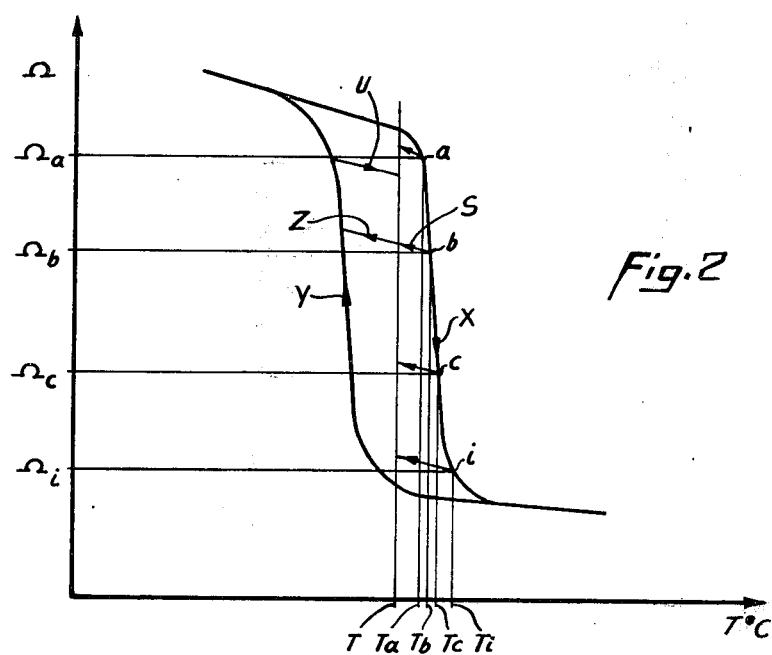
FIG. 2 illustrates the characteristic of the temperature sensitive device used in the present invention.

The temperature sensitive device must be made of a material exhibiting a significant hysteresis centered about a predetermined transition temperature T as illustrated in FIG. 2 of the drawings. The temperature sensitive device must also exhibit a significant impedance change about such transition temperature to allow discrimation of a large number of identical temperature impedance levels with conventional electronic circuitry. One such material is vanadium dioxide ($VO_2$) which exhibits a sudden change of impedance of about 100 K to about 100 ohms at about 65°C. Of course, other materials exhibiting a transition at a critical temperature may be used. A number of such materials are disclosed in Canadian patent No. 938,735 issued Dec. 18, 1973 to the same assignee as the present application. In saying that the useful materials must have a significant amount of hysteresis in their characteristic, it is meant that their impedance-temperature characteristic must be such that the return to their low temperature phase is at a slightly lower temperature as illustrated by arrows X and Y in FIG. 2 of the drawings. The above mentioned transition temperature T at which the temperature sensitive material is maintained in the store mode is within and preferably midway in the transition region.

The impedance of temperature sensitive device 10 is read by any suitable impedance to voltage converter 16, such as an emitter-follower, which provides an output voltage proportional to the impedance values $\Omega a$, $\Omega b$, $\Omega c$.... $\Omega i$ of the temperature sensitive device 10. In the write-in mode, a switch 18 connects the output of a comparator 20 to the heater 12. Comparator 20 has two inputs, one to which is applied an input signal to be stored and the other the output voltage of converter 16. Comparator 20 compares the input voltage to the output voltage derived from the temperature sensitive device 10 and acts to cause the output voltage of converter 16 to coincide with the input voltage by adjusting the current fed to the heater through switch 18. The temperature of the temperature sensitive device 10 is thus raised to $T_a$, $T_b$, $T_c$, . . . $T_i$ depending on the input signal and the impedance value of the temperature sensitive device set to $\Omega a$, $\Omega b$, $\Omega c$.... $\Omega i$ respectively.

In the store mode of the analog memory system, the heater 12 is connected to the output of a comparator 22 through the switch 18. The comparator 22 has an input connected to a temperature reference signal which corresponds to the transition temperature T and a second input connected to the temperature sensor 14. In operation, the temperature sensor 14 continuously monitors the temperature of the temperature sensitive device 10 and produces a signal proportional to such temperature. The temperature sensor signal is compared to the temperature reference signal and the difference between the two signals is fed to heater 12 and, consequently, any tendency toward temperature change brings about appropriate modification in heater current to maintain the temperature of the temperature sensitive device 10 at the transition temperature T. When the switch 18 is returned to its store position, the temperature of the temperature sensitive device 10 will return to T but, because of the hysteresis, the impedance of the temperature sensitive device will not change substantially. For example, let us assume that the first value of the input voltage read and stored in the memory corresponded to a measured impedance value $\Omega a$ and that switch 18 is turned to the write-in position to monitor the input voltage again. If the new impedance value corresponding to the newly read input voltage goes up to $\Omega b$ and the switch is turned back to its store position, the new stored value of impedance will, because of hysteresis, stabilize slightly above $\Omega b$. The analog memory system therefore stores the signal read everytime the switch 18 is turned to its write-in position. The signal stored is slightly above the write-in value but this is insignificant because such error could be compensated by any well known technique. Similarly, if a previously measured impedance value $\Omega b$ is stored in the memory system and that switch 18 is turned to the write-in position to monitor a new input voltage corresponding to an impedance value $\Omega a$, the current to heater 12 would be reduced to a value such that the temperature sensitive device 10 will cool following the path illustrated by arrow Z in FIG. 2 and up the path illustrated by arrow Y until it gets to the value $\Omega a$. When the switch 18 is turned back to its store position, the impedance of the temperature sensitive device will stabilize at a point which is slightly lower than $\Omega a$ as indicated by arrow U in FIG. 2 of the drawings.

Figure 3:
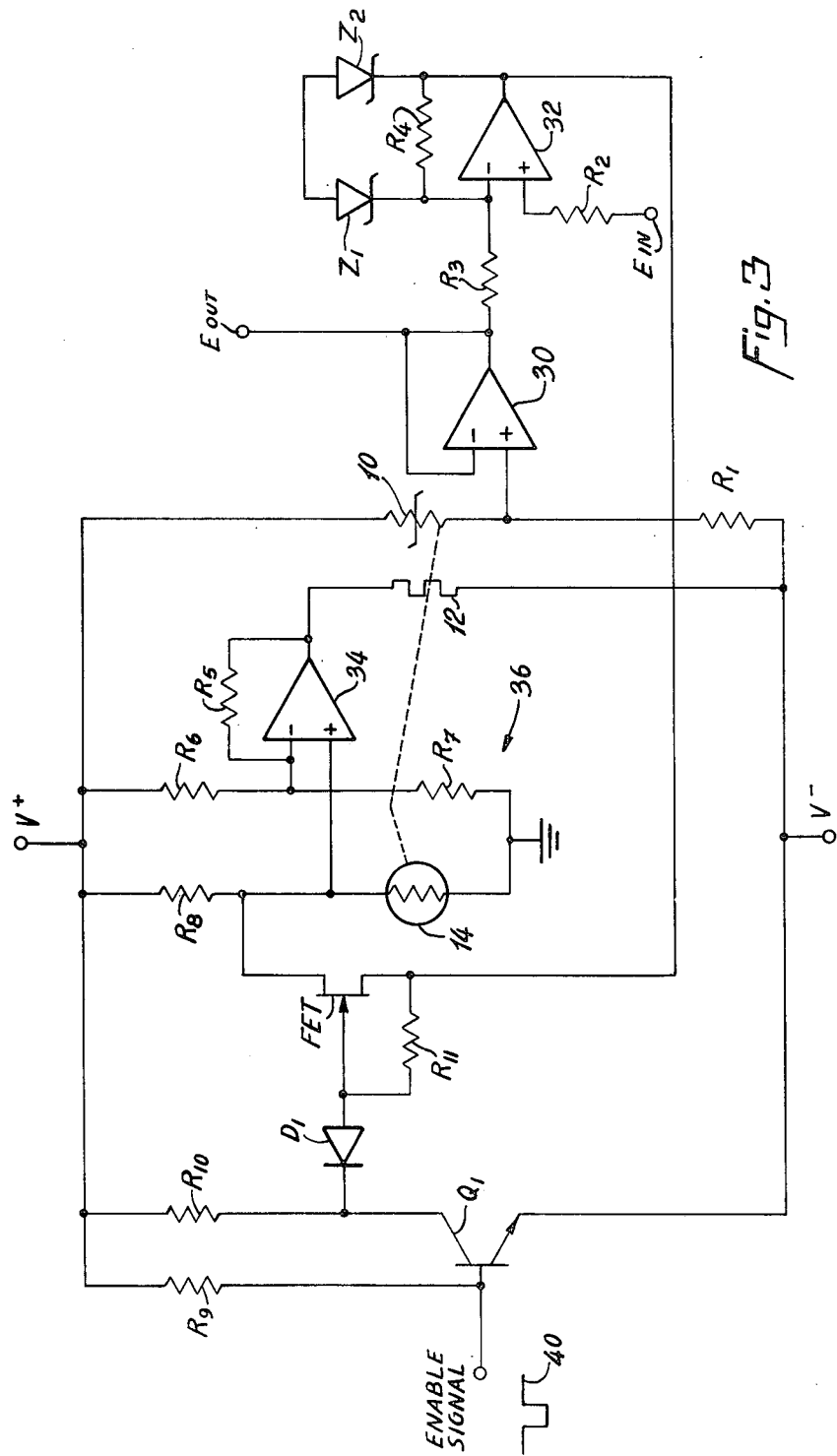
FIG. 3 illustrates the detailed circuit of the block diagram of FIG. 1.

FIG. 3 illustrates a detailed circuit of the embodiment illustrated diagrammetrically in FIG. 1. In this embodiment, the elements corresponding to the ones illustrated in FIG. 1 have been designated by the same reference characters and have not been further disclosed. The temperature sensitive device 10 is connected in series with a resitor $R_1$ across a positive source $V^+$ and negative source $V^-$ and the impedance of the temperature sensitive device is read by an operational amplifier 30 corresponding to element 16 of FIG. 1. Amplifier 30 has its positive input terminal connected to a point interconnecting temperature sensitive device 10 and resistor $R_1$ and its negative terminal connected to its output terminal. As mentioned previously in the description of FIG. 1, the output of the operational amplifier 30 is the output of the memory system.

The signal to be stored in the memory system is fed to the positive input terminal of an operational amplifier 32 (corresponding to comparator 20 of FIG. 1) through a resistor $R_2$ whereas the output of the operational amplifier 30 is connected to the negative terminal of operational amplifier 32 through resistor $R_3$. The output of the operational amplifier 32 is connected to a field effect transistor FET which acts as switch 18 of FIG. 1. A resistor $R_4$ is connected between the negative input and the output of the operational amplifier 32 to control the gain thereof. Zener diodes $Z_1$ and $Z_2$ are connected back to back across resistor $R_4$ to limit the output excursion of operational amplifier 32.

The current fed to heater 12 to maintain the transition temperature T in the store mode of the memory system is adjusted by operational amplifier 34 the gain of which is governed, in known manner, by the value of resistor $R_5$. The value of the current fed to the heater is determined by a bridge circuit designated generally by reference 36 and comprising resistors $R_6$, $R_7$, and $R_8$, as well as a temperature sensor 14. Resistors $R_6$ and $R_7$ are connected in series across voltage source $V^+$ and ground and the point interconnecting resistors $R_6$ and $R_7$ is connected to the negative terminal of operational amplifier 34. Resistor $R_8$ and temperature sensor 14 are also connected in series between source $V^+$ and ground and the point interconnecting resistor $R_8$ to temperature sensitive device 14 is connected to the positive terminal of the operational amplifier.

As it will be understood, the relative values of the elements of the bridge are chosen so as to maintain the temperature sensitive device 10, independent of voltage variation in source $V^+$, at the above mentioned transition temperature T which, as seen previously, is in the middle of the transition region of the temperature sensitive device 10.

The field effect transistor FET is controlled by the enable signal 40 fed to the base electrode of transistor $Q_1$. Transistor $Q_1$ is biased by resistors $R_9$ and $R_{10}$ and the signal 40 fed to its base electrode is amplified and fed to the control electrode of the field effect transistor FET through diode D1. The polarity of diode D1 renders the field effect transistor FET conductive only during the negative portion of the signal 40. A resistor $R_{11}$ is connected between the output of operational amplifier 32 and the control electrode of field effect transistor FET for gate referral.

The circuit of FIG. 3 operates the same way as the one of FIG. 1 except that manual switch 18 is replaced by an electronic switch which operates when desired so as to monitor the input signal fed to the operational amplifier 32 and store such signal in the memory. It will be easily understood that the output of operational amplifier 32 unbalances the bridge circuit to vary the current fed to heater 12.

It will be easily seen that the above disclosed analog memory system provides non destructive read out and indefinite storage. This is inherent to the nature of the temperature sensitive device used in the memory system. In addition, simultaneous store and read out may be performed with the above disclosed memory system. This is an advantage over other memories which require separate read and store modes to ensure the integrity of the stored signal.

It is to be understood that the invention is not limited to the detailed circuitry of FIG. 5 nor to the block diagram illustrated in FIG. 1 but that various modifications may be made to the above embodiments falling within the wording of the claims. For example, various means may be used to adjust the temperature of the temperature sensitive device in accordance with the signal to be stored in the memory. Similarly, various means may be used to maintain the temperature of the temperature sensitive device at the transition temperature in the store mode of the memory. Furthermore, any means may be used for accurately converting the impedance of the temperature sensitive device into an analog of the signal stored in the memory.

What is claimed is:

1. An analog memory system comprising:
  a. a temperature sensitive device exhibiting a significant hysteresis centered about a predetermined transition temperature and a significant impedance change about said transition temperature to allow discrimination of a large number of identical temperature impedance levels;
  b. means for adjusting the temperature of said temperature sensitive device to write-in an input signal to be stored in the form of a predetermined impedance of said temperature sensitive device;
  c. means for subsequently adjusting the temperature of said temperature sensitive device at said transition temperature to store said input signal; and
  d. a converter for converting the impedance of said temperature sensitive device to an analog of the signal stored in the memory system.

2. An analog memory system as defined in claim 1, wherein said means for writing-in the input signal to be stored comprises a heater for heating said temperature sensitive device, a comparator having a first input adapted for connection to a source of input signal to be stored, a second input connected to the output of said converter and an output terminal, and switching means for connecting the output terminal of said comparator to said heater in the write-in mode of said memory system.

3. An analog memory system as defined in claim 2, wherein said means for adjusting the temperature of said temperature sensitive device at said transition temperature comprises a source of reference signal representing said transition temperature, a temperature sensor capable of generating a signal representing the temperature of said temperature sensitive device, and a second comparator having a first input connected to said source of reference signal, a second input connected to said source of sensor signal and an output terminal, said switching means connecting the output terminal of said second comparator to said heater in the store mode of the memory system for adjusting the current flowing through the heater so as to maintain the temperature of said temperature sensitive device at said transition temperature.

4. An analog memory system as defined in claim 3, wherein said second comparator comprises a bridge circuit which includes said temperature sensor as one of the legs of the bridge circuit and an operational amplifier for amplifying the output of the bridge circuit.

5. An analog memory system as defined in claim 2, wherein said switching means is a field effect transistor and further comprising means connected to said field effect transistor for enabling said field effect transistor at desired times to establish write-in or store operations.

* * * * *